July 18, 1950 J. C. COE 2,515,196

AUTOMATIC GAIN CONTROL

Filed Nov. 26, 1945

Inventor

JAMES C. COE

By M. A. Hayes

Attorney

Patented July 18, 1950 2,515,196

UNITED STATES PATENT OFFICE 2,515,196

AUTOMATIC GAIN CONTROL

James C. Coe, Inyokern, Calif.

Application November 26, 1945, Serial No. 630,962

11 Claims. (Cl. 250—20)

Figure 1:
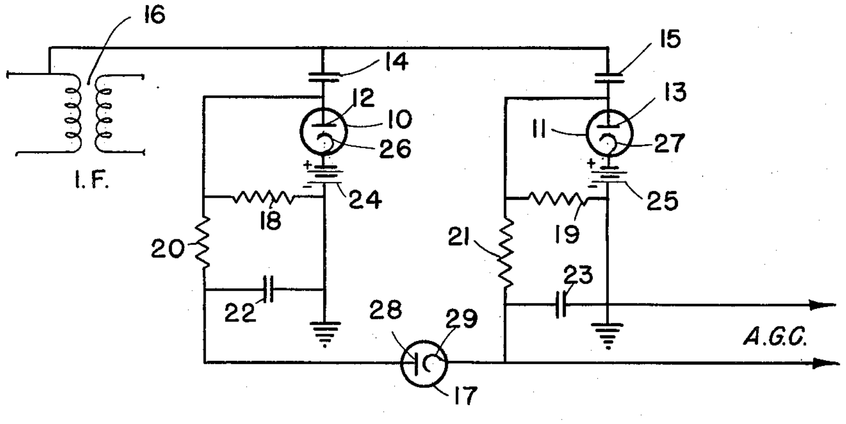

(Granted under the act of March 3, 1883, as amended April 30, 1928; 370 O. G. 757)

This invention relates to differential time constant automatic gain controls for radio receivers, and particularly to automatic gain control circuits wherein a rectifier is provided to develop a gain reducing potential in a circuit of relatively long time constant, and an additional rectifier is provided in a relatively short time constant circuit to discharge the gain reducing potential.

A general object of the invention is to provide an automatic gain control (AGC) circuit for a receiver which will tend to maintain high receiver sensitivity under changing signal strengths. Thus, the objective is to cause slow desensitization of the receiver with increasing signal strength to permit high amplification of the signal to continue for an appreciable time after the signal strength has started to rise, and to cause rapid increase of the amplification as the signal strength starts to fade.

More particularly, an object of the invention is to provide an AGC circuit for a radio receiver, preferably for amplitude modulated carrier wave reception, which will operate without interfering with the reproduction of the lower frequency audio modulations and at the same time will provide rapid recovery of the receiver gain upon a reduction in the average carrier intensity.

The AGC circuits generally utilized in radio reception employ a rectifier for producing a negative potential which increases negatively with an increasing intensity of the incoming carrier. This potential is applied to a filtering network and is used to control the gain of signal amplifying circuits. The charging time constant of the filtering network must be long enough to insure that low audio frequencies will not actuate the circuit, but a short discharge time constant is desirable to permit rapid recovery of sensitivity with signal fading. In the common AGC circuits, the charging time will be appreciably shorter than the discharge time, as is later explained. The circuit constants chosen for the common AGC circuit must be a compromise, and the resultant time constant is usually between 0.1 and 0.2 second. In a circuit with a discharge time constant of the order of 0.1 second or longer, atmospheric static and man-made noise of an intermittent nature may actuate the AGC system resulting in receiver desensitization. The desensitization will continue until some time after the end of the noise; and when additional noise pulses are received, spaced as close together as the discharge time constant of the AGC system, the system receives each added noise pulse before the effects of the first can wear off, resulting in an accumulated negative AGC voltage and continuing desensitization of the receiver.

It is accordingly an additional object of the invention to provide an AGC circuit which will have a long time constant charging circuit to minimize the desensitizing effects of a single noise pulse, or of a series of pulses, but will have a comparatively fast discharging time to prevent accumulation of AGC voltage from a group of separate pulses and to restore receiver sensitivity rapidly after the end of the noise.

Figure 2:
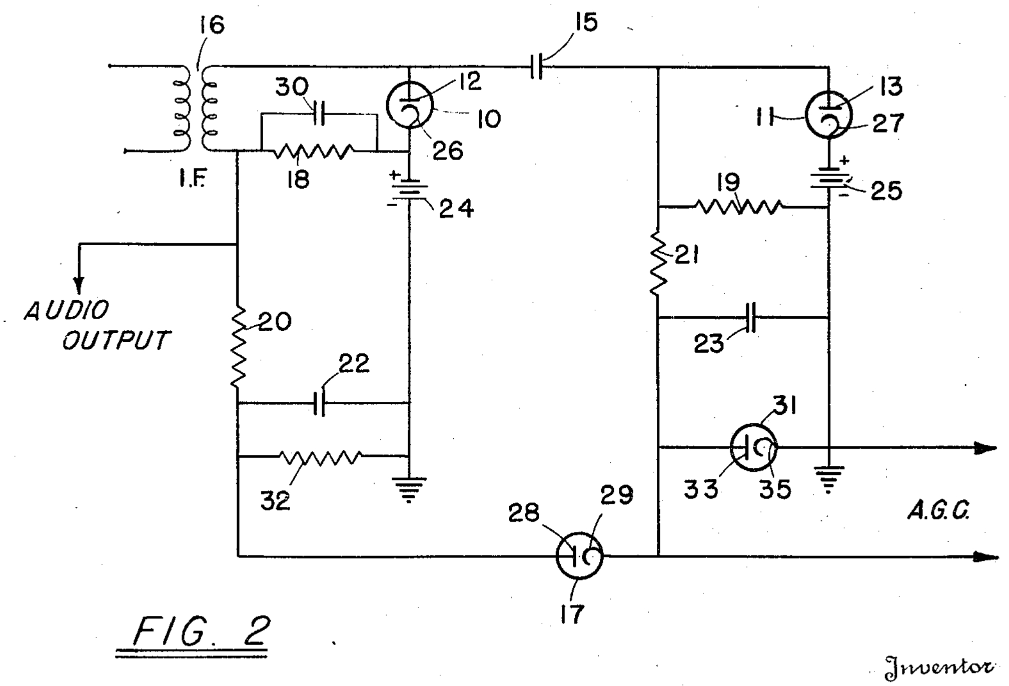

Further objects and advantages of the invention will appear from the following discussion taken in conjunction with the drawings, in which:

Fig. 1 is a diagrammatic presentation of an automatic gain control circuit in accordance with the invention, and Fig. 2 is a diagrammatic presentation of an automatic gain control circuit in accordance with the invention adapted for incorporation into the diode detector stage of a radio receiver circuit.

In accomplishing the objects of the invention, two circuits are used, each of which produces a separate negative biasing potential proportioned to the signal intensity. The first circuit has a long time constant on charging, in response to carrier intensity increase, so that the negative potential produced by this circuit builds up slowly with increasing carrier intensity. The second circuit has a short time constant, the condenser of which discharges rapidly with decreasing signal intensity. A rectifier, which conducts direct current in one direction only, prevents the condenser in the first circuit from ever becoming more negative than the condenser in the second circuit.

The invention, as shown in Fig. 1, is embodied in a circuit comprising two similar diodes 10 and 11, which may be sections of a single tube, such as a 6H6, with plates 12 and 13 respectively connected through condensers 14 and 15 to a point in an intermediate frequency amplifier circuit of a radio receiver. The connection to condensers 14 and 15 is preferably made to that end of the primary winding of the final I. F. transformer 16 on which the I. F. potential is impressed. The detector circuit of the receiver is not shown but may be connected to the secondary winding of I. F. transformer 16 in the conventional manner. Associated with diodes 10 and 11 are filter circuits comprising resistors and capacitors, the circuit associated with diode 10 having a faster time constant than that associated with diode 11. Diode 10 is connected to rectify the signal voltages impressed through condenser 14 and to develop across load resistor 18 a negative direct current potential of a value related to the average signal strength. Audio frequency modulation of the signal will produce audio potentials across the load resistor, but these will be subjected to the blocking action of a resistor 20 and by-passing through condenser 22. The circuit of resistor 20 and condenser 22 has a relatively fast time constant, having low resistance and capacity values, and a direct current potential produced on the ungrounded side of condenser 22 can change rapidly with changing signal strength. A positive bias potential is applied to cathode 26 of diode 10 from a potential source such as battery 24 to delay rectification by the diode until a predetermined signal intensity is exceeded.

The signal fed through condenser 15 is applied to the plate 13 of diode 11 and is rectified in a manner similar to that described above to produce across load resistor 19 a D. C. potential and audio frequency potentials in accordance with the signal. Values for resistor 21 and condenser 23 are chosen such that their RC product (time constant) is greater than for resistor 20 and condenser 22. The time constants may be in the ratio of approximately 5:1, but this value is not critical. Positive bias is applied to cathode 27 of diode 11 by a source indicated as a battery 25 to delay rectification until a predetermined signal intensity is exceeded, this bias being preferably of substantially equal voltage and applied as in the circuit of diode 10.

Diode 17 interconnects the ungrounded side of condenser 22 and the ungrounded side of condenser 23, cathode 29 being connected directly to condenser 23, and anode 28 being connected to condenser 22.

In general, the values of circuit constants for satisfactory operation of the device shown in Fig. 1 are selected so that: the product of the values of condenser 22 and the series resistance of resistors 18 and 20 is less than the product of the values of condenser 23 and the series resistance of resistors 19 and 21; and the value of resistor 18 is greater than the value of resistor 19, or the voltage of battery 25 is made greater than the voltage of battery 24. Specific values that have been found suitable in a particular application are as follows, it being understood that these values are exemplary only:

| | | |
|---|---|---|
| Condenser 14 | mfd | .00025 |
| Condenser 15 | mfd | .00025 |
| Condenser 22 | mfd | 0.05 |
| Condenser 23 | mfd | 0.2 |
| Resistor 18 | meg | 1.0 |
| Resistor 19 | meg | 0.5 |
| Resistor 20 | meg | 0.2 |
| Resistor 21 | meg | 1.0 |
| Battery 24 | volts | 3 |
| Battery 25 | do | 3 |

The general operation of the device in accordance with Fig. 1 is such that diode 17 is normally non-conductive, and the negative potential produced on the ungrounded side of condenser 23 by received carrier rectification is available for gain reduction in the receiver, such as for grid biasing in the I. F. amplifier circuits. The potential produced on condenser 23 is slightly less for a given carrier strength than that produced on condenser 22, since load resistor 18 is of a higher value than resistor 19 if bias batteries 24 and 25 are of equal voltage. A similar effect may be obtained by other circuit adjustments, as by increasing the positive bias voltage on cathode 27 to a greater value than for cathode 26. Decreasing carrier intensity results in a rapid decrease in the negative potential appearing on the ungrounded side of condenser 22 and anode 28 of diode 17. Diode 17 is accordingly made conductive to drain off the negative potential on the ungrounded side of condenser 23, reducing the negative AGC bias and increasing receiver gain much more rapidly than would occur if condenser 23 had only the discharge path through resistors 21 and 19 in series. A subsequent increase in carrier strength rapidly causes a relatively high negative potential on condenser 22 and anode 28, which does not reach the AGC output, being blocked by the diode 17. The potential on condenser 23 is slowly built up through high resistance 21, resulting in a slow decrease in receiver gain.

In the conventional AGC circuit the gain-reducing potential would be produced on a condenser, such as condenser 23 through rectification of the carrier. Charging of the condenser through a series resistor, such as resistor 21, would be rapid in comparison to the slow discharge through the series resistor and the load resistor, such as resistors 21 and 19, in series. As heretofore explained, the circuit of this invention provides a substantially slower charging rate than the discharging rate of the AGC potential on condenser 23.

The circuit disclosed in Fig. 2 is in most respects substantially the same as that of Fig. 1. Diode 10 of Fig. 2 is utilized as the detector for the receiver to which the device is applied and also furnishes a D. C. potential to condenser 22 and anode 28 of diode 17. An R. F. by-pass or load capacitor 30 is provided in parallel with load resistor 18. The audio voltages may be taken off in the conventional manner from the anode end of the load resistor as indicated. A resistor 32 may be provided as shown across condenser 22 to decrease the discharge time constant of the condenser 22 if the discharge time through resistors 20 and 18 is longer than desired. The load resistance 18 is connected directly to the cathode 26 of diode 10 to provide for detection of signals of low intensity, since the circuit of Fig. 1 would produce no potentials across the load resistance 18 until the signal reaches an intensity sufficient to overcome the bias against diode 10. The connections shown in Fig. 2 cause a positive potential to appear on the ungrounded side of condenser 22 in the absence of a signal of at least a predetermined intensity. This potential would appear, through diode 17, on the ungrounded side of AGC condenser 23 unless preventive means were provided. Accordingly, diode 31 is connected across the terminals of condenser 23 in such a way as to cause any positive charge on the ungrounded side to be shunted to ground by driving anode 33 positive with respect to grounded cathode 35, causing conduction of the diode. Connections to the signal rectifying diodes are slightly altered by connecting anode 12 directly to the I. F. transformer 16 secondary and furnishing a condenser 15 between the transformer secondary and anode 13 of diode 11, although other convenient means of applying signal potentials to the diodes will be readily apparent.

Exemplary values for the components of an operative circuit as shown in Fig. 2 may be as follows:

| | | |
|---|---|---|
| Condenser 15 | mfd | .00025 |
| Condenser 22 | mfd | .2 |
| Condenser 23 | mfd | .2 |
| Condenser 30 | mfd | .0001 |
| Resistor 18 | meg | 1.0 |
| Resistor 19 | meg | 0.5 |
| Resistor 20 | meg | 0.1 |
| Resistor 21 | meg | 2.0 |
| Resistor 32 | meg | 1.0 |
| Battery 24 | volts | 3 |
| Battery 25 | do | 3 |

The operation of the circuit of Fig. 2 is also basically similar to that of Fig. 1. A carrier of sufficient intensity to overcome the bias against diode 11 will slowly build up a negative AGC potential through high resistance 21 on condenser 23. This carrier will also rapidly produce a slightly greater negative potential on condenser 22 through relatively low resistance 20. The potential on condenser 22 will be greater because load resistor 18 is of a higher value than load resistor 19. The negative potential on condenser 23 is applied as an AGC potential to reduce amplification in the appropriate receiver circuits. A reduction in carrier strength, or fading, will result in rapid discharge of condenser 22 through resistors 20 and 18 in series and through the parallel path comprising resistor 32 if resistor 32 is included in the circuit. Condenser 23 begins to slowly discharge through resistors 21 and 19 in series but is rapidly discharged as soon as the potential on condenser 22 has decreased sufficiently to cause anode 28 of diode 17 to become less negative than cathode 29, providing the additional discharge path through diode 17 and resistor 32 in parallel with series resistors 20 and 18. As the carrier intensity is reduced to a low value rectification in diode 11 stops, zero potential appears on condenser 23 and in the AGC connection to the receiver amplifying stages, and the potential on the ungrounded side of condenser 22 is made positive by battery 24. This positive potential is prevented from appearing on condenser 23 by diode 31 which is made conductive to prevent a positive potential from appearing on the condenser.

It will be apparent to those skilled in the art that various kinds of rectifiers, such as metal oxide types, may be substituted for the diodes shown. Alternatively, grid controlled electron tubes may be utilized instead of or combined with rectifiers. In some applications filters may prove desirable, as for instance in series with the connection between the ungrounded side of condenser 22 and anode 28 of diode 17 in the circuit of Fig. 1 or Fig. 2. The carrier wave may be applied for rectification otherwise than from the last I. F. transformer. It may even be desirable under certain circumstances to obtain one of the voltages needed for the device from the cathode resistor of an amplifier tube of the receiver. It is accordingly desired that I be limited only by the scope of the appended claims.

The invention described herein may be manufactured and used by or for the Government of the United States of America for governmental purposes without the payment of any royalties thereon or therefor.

What is claimed is:

1. In a rectifier circuit for alternating current, a condenser connected for charging through an alternating current rectifier, a relatively high resistance discharge path connected to said condenser, a separate and distinct relatively low resistance discharge path connected to said condenser through a second rectifier, and means responsive to a decrease in the current strength and coupled to the second rectifier for rendering said second rectifier conductive.

2. In a rectifier circuit for alternating current, direct current potential storage means, means connected to said storage means for relatively slowly charging said storage means to a potential related to the average intensity of the alternating current potential, a separate and relatively rapid discharge means connected to said storage means and comprising a rectifier in a fast time constant discharge circuit, and means coupled to said rectifier for rendering said rectifier conductive upon a decrease in the current strength.

3. In an automatic gain control for a radio receiver comprising a rectifier for charging a first condenser in a relatively long discharge time constant circuit with a gain control potential related to the average signal intensity, means for providing a second potential related to the average signal intensity on a second condenser in a relatively fast discharge time constant circuit, and rectifier means connected between said condensers for preventing the potential of the charge on said first condenser from exceeding the potential of the charge on said second condenser.

4. In an automatic gain control for a radio receiver, a short time constant circuit including a rectifier for producing on a condenser a potential related to the average intensity of high frequency current in the receiver, a second rectifier connected to a long time constant circuit for producing on a second condenser a second potential related to the average intensity of said high frequency current, and rectifying means interconnecting said circuits for rapidly discharging said second condenser in response to a differential potential of predetermined polarity between said condensers.

5. In an automatic gain control for a radio receiver, a short time constant circuit including a rectifier for producing on a condenser a potential related to the average intensity of high frequency current in the receiver, a second rectifier connected in a long time constant circuit for producing on a second condenser a second potential related to the average intensity of said high frequency current, said second potential being supplied as an automatic gain control voltage, and rectifying means connected between said circuits and responsive to a decrease in said average intensity for rapidly discharging said second condenser in response to rapid discharge of said first condenser.

6. The combination with the detector of a radio receiver of a short time constant circuit for producing on a condenser a potential related to the average intensity of high frequency current through the detector, a rectifier for producing a gain control potential on a second condenser in a long time constant circuit, and rectifier means connected between said condensers and providing a rapid discharge path for said second condenser in comparison with its charging rate, said means being responsive to a differential potential of predetermined polarity between said condensers.

7. In an automatic gain control for a radio receiver comprising a rectifier for producing on a condenser in a relatively long charge time constant circuit a gain control potential governed by the average carrier wave intensity, means for biasing said rectifier to an inoperative condition for signal intensity less than a predetermined intensity, means for providing a second potential related to the average carrier wave intensity on a second condenser in a relatively fast discharge time constant circuit, means for biasing said last means to inoperative condition for signal intensity less than a second predetermined intensity, and discharge means connected between said condensers for preventing said gain control potential from exceeding said second potential.

8. In a rectifier circuit for converting alternating current into direct current, a condenser, first rectifier means for charging said condenser to a first potential related to the potential of the alternating current, a relatively high resistance discharge path for said condenser permitting said first potential to follow only slow variations of the amplitude of said alternating current, a second condenser, second rectifier means for charging said second condenser to a second potential related to the potential of said alternating current and greater than said first potential, a relatively low resistance discharge path for said second condenser whereby said second potential follows rapid variations in the amplitude of said alternating current and may become less than said first potential, and additional rectifier means for discharging said first condenser through said low resistance discharge path when said second potential becomes less than said first potential.

9. The combination according to claim 8 wherein said first rectifier means provides a negative potential on one plate of the first-mentioned condenser, and additional rectifier means shunting said first-mentioned condenser for short-circuiting a positive charge on said one plate.

10. The combination in an automatic gain control system for a radio receiver of a condenser, means for charging said condenser to a potential related to the average intensity of the received carrier, a relatively long time constant discharge path for said condenser, a relatively short time constant discharge path connected to said condenser through a rectifier, the last-mentioned path being separate from said charging means and the first-mentioned path, and means responsive to a decline in the carrier strength and coupled to said rectifier for rendering said rectifier conductive.

11. In a radio receiver, the combination comprising automatic gain control means including a condenser and means for relatively slowly charging said condenser to a potential related to the average intensity of the received carrier, discharge means for said condenser comprising a relatively short time constant circuit separate from said charging means and connected to said condenser through an electron tube, and means responsive to a decreasing received carrier intensity for rendering said tube conductive.

JAMES C. COE.

REFERENCES CITED

The following references are of record in the file of this patent:

UNITED STATES PATENTS

| Number | Name | Date |
|---|---|---|
| 1,931,866 | Heising | Oct. 24, 1933 |
| 2,115,876 | Roberts | May 3, 1938 |
| 2,129,029 | Roberts | Sept. 6, 1938 |
| 2,154,091 | Holst | Apr. 11, 1939 |
| 2,156,846 | Getaz | May 2, 1939 |
| 2,252,066 | Dallos | Aug. 12, 1941 |
| 2,262,841 | Goddard | Nov. 18, 1941 |

FOREIGN PATENTS

| Number | Country | Date |
|---|---|---|
| 673,988 | Germany | Apr. 1, 1939 |